(12) United States Patent
Liu et al.

(10) Patent No.: US 11,340,562 B2
(45) Date of Patent: May 24, 2022

(54) SELF-ADAPTIVE CONFIGURATION METHOD AND SYSTEM FOR LINKAGE RESPONSE OF CONSTRUCTION TYPE, MOTION TYPE, CONTROL TYPE AND OPTIMIZATION TYPE

(71) Applicant: GUANGDONG UNIVERSITY OF TECHNOLOGY, Guangzhou (CN)

(72) Inventors: Qiang Liu, Guangzhou (CN); Jiewu Leng, Guangzhou (CN); Duxi Yan, Guangzhou (CN); Ding Zhang, Guangzhou (CN); Hao Zhang, Guangzhou (CN)

( * ) Notice: Subject to any disclaimer, the term of this patent is extended or adjusted under 35 U.S.C. 154(b) by 113 days.

(21) Appl. No.: 17/072,722

(22) Filed: Oct. 16, 2020

(65) Prior Publication Data
US 2021/0286325 A1  Sep. 16, 2021

(30) Foreign Application Priority Data
Mar. 16, 2020 (CN) .......................... 202010181482.0

(51) Int. Cl.
*G06G 7/48* (2006.01)
*G05B 13/02* (2006.01)
(Continued)

(52) U.S. Cl.
CPC .......... *G05B 13/024* (2013.01); *B25J 9/1605* (2013.01); *G05B 19/41885* (2013.01);
(Continued)

(58) Field of Classification Search
CPC ............. B25J 9/1605; G05B 19/41885; G05B 2219/31343; G05B 2219/32085;
(Continued)

(56) References Cited

U.S. PATENT DOCUMENTS 9,996,696 B2    6/2018 Baji-Gal
2009/0198350 A1  8/2009 Thiele
(Continued)

FOREIGN PATENT DOCUMENTS

CN    106021733 A    10/2016
CN    107832497 A *  3/2018  ....... G05B 19/41885
(Continued)

OTHER PUBLICATIONS

Rekeik et al. State of Art of Optimization Methods for Assembly Line Design Annual Reviews in Control 26, pp. 163-174 (Year: 2002).*
(Continued)

*Primary Examiner* — Rehana Perveen
*Assistant Examiner* — Cuong V Luu (57) ABSTRACT

Disclosed are a self-adaptive configuration method and system for linkage response of a construction type, a motion type, a control type and an optimization type. The disclosure aims to provide the self-adaptive configuration method and system for linkage response of quick adjustment and design of a workshop production line. The self-adaptive configuration method comprises the following steps of step A: construction type configuration; step B: motion type design; step C: control type design; and step D: optimization type evolution, wherein the step D comprises first-level iterative optimization, second-level iterative optimization and third-level iterative optimization. A closed optimization cycle is formed by the first-level iterative optimization, the second-level iterative optimization and the third-level iterative optimization jointly, and the multi-level iterative optimization is performed on the production line linkage design framework, so that the workshop production line can be self-adaptively and quickly adjusted and designed.

10 Claims, 6 Drawing Sheets

(51) Int. Cl.
*G06F 30/20* (2020.01)
*B25J 9/16* (2006.01)
*G05B 19/418* (2006.01)

(52) U.S. Cl.
CPC .... *G06F 30/20* (2020.01); *G05B 2219/31343* (2013.01); *G05B 2219/31372* (2013.01)

(58) Field of Classification Search
CPC .......... G05B 19/4188; G05B 19/41865; G06F 30/20; Y02P 90/02
See application file for complete search history.

(56) References Cited

U.S. PATENT DOCUMENTS

| | | | |
|---|---|---|---|
| 2016/0018796 A1 | 1/2016 | Lu | |
| 2020/0249663 A1* | 8/2020 | Liu | G05B 19/41885 |

FOREIGN PATENT DOCUMENTS

| | | | |
|---|---|---|---|
| CN | 107861478 A | | 3/2018 |
| CN | 108320069 A | | 7/2018 |
| CN | 108847979 A | | 11/2018 |
| CN | 110196575 A | | 9/2019 |
| CN | 111230887 A | * | 6/2020 |
| CN | 111611646 A | | 9/2020 |
| EP | 1914610 A2 | | 4/2008 |

OTHER PUBLICATIONS

Qiang Liu et al."Digital twin-driven rapid individualised designing of automated flow-shop manufacturing system", International Journal of Production Research, vol. 57, No. 12, May 8, 2018, pp. 3903-3919.

Dávid Gyulai et al."Robust production planning and control for multi-stage systems with flexible final assembly lines", International Journal of Production Research, vol. 55, No. 13, Jun. 20, 2016, pp. 3657-3673.

Zhao Yang et al."Intelligent Production Management and Control for Aircraft Assembly Pulsation Line Based on Digital Twin", Aeronautical Manufacturing Technology, vol. 63, No. 1/2, Jan. 31, 2020, pp. 14-20.

* cited by examiner

SELF-ADAPTIVE CONFIGURATION METHOD AND SYSTEM FOR LINKAGE RESPONSE OF CONSTRUCTION TYPE, MOTION TYPE, CONTROL TYPE AND OPTIMIZATION TYPE

CROSS-REFERENCE TO RELATED APPLICATIONS

This application claims priority to Chinese Patent Application No. 202010181482.0 with a filing date of Mar. 16, 2020. The content of the aforementioned applications, including any intervening amendments thereto, are incorporated herein by reference.

TECHNICAL FIELD

The disclosure relates to the field of industrial automation technologies, and more particularly, to a self-adaptive configuration method and system for linkage response of a construction type, a motion type, a control type and an optimization type.

BACKGROUND

With the development of social economy, individualized demands for workshop production lines are increasingly finer. A workshop design method based on static configuration design is generally used in the existing workshop production lines, which only focuses on small closed-loop control of engineering elements such as a device, a technology, and the like, without optimizing the whole line design from an overall view of workshop design. Therefore, device control, device integration, technological optimization and workshop integration of a whole line cannot be optimized, and a design effect is difficult to be guaranteed. Moreover, since products in the workshop are frequently changed due to individualized demands, an overall structure of the workshop needs to be adjusted in a short time to respond quickly to the demand. However, a current workshop design method lacks an effective linkage response mechanism, and cannot self-adaptively and quickly adjust configuration parameters, a structure and a control scheme of the production line and solve the workshop integration problem.

SUMMARY

Aiming at the above defects, an objective of the disclosure is to provide a self-adaptive configuration method and system for linkage response of quick adjustment and design of a workshop production line, which implements the self-adaptive quick adjustment and design of the workshop production line by performing multi-level iterative optimization on a production line linkage design framework.

In order to achieve the objective, the technical solutions used in the disclosure are as follows.

A self-adaptive configuration method for linkage response of a construction type, a motion type, a control type and an optimization type comprises the following steps of:

step A: construction type configuration: building a three-dimensional model of each real-object device in a simulation system to form a plurality of real-object device digital models, and assembling the plurality of real-object device digital models in the simulation system according to design requirements of a production line to form a production line layout model;

step B: motion type design: compiling motion control scripts of all the real-object device digital models in the production line layout model in the simulation system according to the design requirements of the production line, and controlling machining motions of the real-object device digital models and logistics transportation of work-in-process through a script language;

step C: control type design: the simulation system being provided with a control center for controlling the production line layout model and the real-object device to operate;

establishing real-time communication and motion synchronization between each real-object device and the corresponding real-object device digital model in the production line layout model by using a digital twin technology;

setting an upper computer, establishing a binary channel of instruction downlink and information uplink for the upper computer and the control center, so that the upper computer issues a production instruction to the control center and the upper computer collects real-time state data of the real-object device;

building an industrial control network for driving the real-object device to operate, issuing, by the control center, the production instruction to the real-object device through the industrial control network and acquiring the real-time state data of the real-object device through the industrial control network; and step D: optimization type evolution: the optimization type referring to iterative optimization of the production line layout model, and the iterative optimization comprising:

first-level iterative optimization, the upper computer comprising a management and control center, the management and control center comprising an execution engine and a MES system, and the MES system analyzing a machining technology and a logistics organization form of products in a workshop, and discriminating a coupling structure of the production line layout model and a coupling optimization problem during production; and the execution engine being a decoupling algorithm with a decoupling mechanism, which solves the coupling optimization problem in the production line layout model, and generates a production scheme of the production line layout model;

two-level iterative optimization, optimizing and adjusting technological motions of the real-object device digital models and a transportation path of the work-in-process in the production line layout model according to the design requirements, optimizing and adjusting the motion control script in the simulation system according to the optimization of the technological motions and the transportation path, and making self-adaptive adjustment synchronously by the industrial control network according to a change of the motion control script; and three-level iterative optimization, rebuilding the production line layout model in the simulation system;

the evolution referring to online simulation production performed on the production line layout model subjected to the first-level iterative optimization, and detecting whether each real-object device meets preset production requirements:

if each real-object device meets the preset production requirements, outputting the current generation of the production line layout model;

if each real-object device does not meet the preset production requirements, determining whether the current generation of the production line layout model is subjected to the second-level iterative optimization;

if the current generation of the production line layout model is not subjected to the second-level iterative optimization, the current generation of the production line layout model entering the second-level iterative optimization;

if the current generation of the production line layout model is already subjected to the second-level iterative optimization, the current generation of the production line layout model entering the third-level iterative optimization first, and then entering the second-level iterative optimization;

after finishing the second-level iterative optimization, determining whether the current generation of the production line layout model is subjected to the third-level iterative optimization;

if the current generation of the production line layout model is not subjected to the third-level iterative optimization, the current generation of the production line layout model entering the first-level iterative optimization again;

if the current generation of the production line layout model is already subjected to the third-level iterative optimization, the production line layout model being defined as a new generation of the production line layout model, and then entering the first-level iterative optimization.

Further, the execution engine is a hyper-heuristic decoupling algorithm, the execution engine performs online self-adaptive adjustment according to a change of a coupling optimization problem in each generation of the production line layout model, and the online self-adaptive adjustment comprises decoupling algorithm parameter adjustment and decoupling algorithm framework adjustment.

Further, the control type design in the step C further comprises: planning and designing an autonomous control system, and dividing the production line layout model into a plurality of autonomous units according to the design requirements of the production line, wherein the control center is provided with unit control centers with a same number as that of the autonomous units, one of the unit control centers independently controls one of the autonomous units to operate, and the real-object device in the workshop constitutes a real-object unit completely consistent with the autonomous unit.

Further, the industrial control network in the step C is a PLC control network.

Further, the PLC control network collects the real-time state data of the real-object device through a SCADC system, and uploads the collected real-time state data to the upper computer.

Further, the evolution in the step D comprises vertical integration evolution and horizontal integration evolution:

in the vertical integration evolution: each real-object unit is respectively connected with the industrial control network at different time periods, and the connected real-object unit and the corresponding autonomous unit perform synchronous simulation production according to the production instruction to detect whether each real-object device in the connected real-object unit is operated according to the production instruction; and in the horizontal integration evolution: two real-object units associated up and down are connected with the industrial control network at the same time period, the two connected real-object units and the corresponding autonomous units perform synchronous simulation production according to the production instruction respectively to detect whether the downstream real-object device always undertakes a machining motion of the upstream real-object device at a junction between the two connected real-object units.

Further, the motion type design in the step B comprises the following steps of:

step B1: making a motion plan of each real-object device digital model and a transportation path plan of the work-in-process according to the design requirements of the production line and the production line layout model;

step B2: compiling the control scripts of all the real-object device digital models in the production line layout model in the simulation system, and completing the motion plan of each real-object device digital model and the transportation path plan of the work-in-process through the control scripts; and step B3: performing an off-line simulation operation on the production line layout model until the off-line operation is normal.

A system using the above self-adaptive configuration method for the linkage response of the construction type, the motion type, the control type and the optimization type comprises a simulation system, an industrial control network and an upper computer;

the simulation system being configured to build the real-object device digital model of each real-object device according to the design requirements of the production line, and assemble the plurality of the real-object device digital models to form the production line layout model;

the simulation system being further configured to compile the control scripts of all the real-object device digital models in the production line layout model, and perform the off-line simulation operation on the production line layout model until the off-line operation is normal;

the simulation system being provided with the control center for controlling the production line layout model and the real-object device to operate;

the real-time communication and the motion synchronization between each real-object device and the corresponding real-object device digital model in the production line layout model being established by using the digital twin technology;

the upper computer being provided, the binary channel of the instruction downlink and the information uplink for the upper computer and the control center being established, so that the upper computer issues the production instruction to the control center and the upper computer collects the real-time state data of the real-object device;

the industrial control network being configured to drive the real-object device to operate, the control center issuing the production instruction to the real-object device through the industrial control network and acquiring the real-time state data of the real-object device through the industrial control network;

the upper computer comprising the management and control center and the configuration monitoring unit;

the management and control center comprising the execution engine, the MES system and the optimization determination module;

the MES system being configured to analyze the machining technology and the logistics organization form of the products in the workshop, and discriminate the coupling structure of the production line layout model and the coupling optimization problem during production;

the execution engine being a decoupling algorithm with a decoupling mechanism, which solves, the coupling optimization problem in the production line layout model, and generates a production scheme of the production line layout model;

the optimization determination module being configured to determine an optimization evolution flow of the production line layout model:

after finishing the evolution, the optimization determination module determining whether each real-object device meets preset production requirements:

if each real-object device meets the preset production requirements, outputting the current generation of the production line layout model;

if each real-object device does not meet the preset production requirements, the optimization determination module determining whether the current generation of the production line layout model is subjected to the second-level iterative optimization;

if the current generation of the production line layout model is not subjected to the second-level iterative optimization, the current generation of the production line layout model entering the second-level iterative optimization;

if the current generation of the production line layout model is already subjected to the second-level iterative optimization, the current generation of the production line layout model entering the third-level iterative optimization first, and then entering the second-level iterative optimization;

after finishing the second-level iterative optimization, the optimization determination module determining whether the current generation of the production line layout model is subjected to the third-level iterative optimization;

if the current generation of the production line layout model is not subjected to the third-level iterative optimization, the current generation of the production line layout model entering the first-level iterative optimization again;

if the current generation of the production line layout model is already subjected to the third-level iterative optimization, the production line layout model being defined as a new generation of the production line layout model, and then entering the first-level iterative optimization; and the configuration monitoring unit being configured to establish a simulation model view according to the real-time state data, and monitor the production line layout model and each real-object device in real time through the simulation model view.

Further, the industrial control network is a PLC control network.

Further, the PLC control network collects the real-time state data of the production line layout model and the real-object device through a SCADC system, and uploads the collected real-time state data to the MES system of the upper computer.

According to the disclosure, the production line linkage design framework is formed through the construction type configuration, the motion type design, the control type design and the optimization type evolution, and self-adaptive synchronous configurations of a model, a logic, an event and a movement are performed under the driving of a specific manufacturing product type, a manufacturing technological system and production device information to form a linkage response mechanism. A materialized structure of a whole line is realized based on the production line linkage design framework, and the online simulation operation is performed on the production line layout model in a form of semi-physical simulation, so that whether each real-object device meets the preset production requirements is analyzed and detected, and an uncertainty between design and manufacturing is reduced, thus improving a design efficiency.

In the optimization type evolution, the workshop design scheme is optimized level by level to meet a manufacturing flexibility necessary for high-frequency production changes and a technological flexibility of a stand-alone device, so that the production line is quickly customized and designed, and progressive lossless propagation of a design idea is ensured. Moreover, a closed optimization cycle is formed by the first-level iterative optimization, the second-level iterative optimization and the third-level iterative optimization jointly, and the multi-level iterative optimization is performed on the production line linkage design framework, so that the workshop production line can be self-adaptively and quickly adjusted and designed.

In the figures, 1 simulation system; 11 production line layout model; 111 autonomous unit; 12 control center; 121 unit control center; 2 real-object device; 21 real-object unit; 3 upper computer; 31 management and control center; 311 execution system; 312 EMS system; 313 optimization determination module; 32 configuration monitoring unit; 4 industrial control network; 41 PLC control network; 5 SCADA system; and 6 hierarchical calculation relationship graph.

DETAILED DESCRIPTION

The technical solutions of the disclosure are further described hereinafter with reference to the accompanying drawings and the specific embodiments.

With reference to FIG. 1 to FIG. 6, a self-adaptive configuration method for linkage response of a construction type, a motion type, a control type and an optimization type comprises the following steps.

Figure 1:
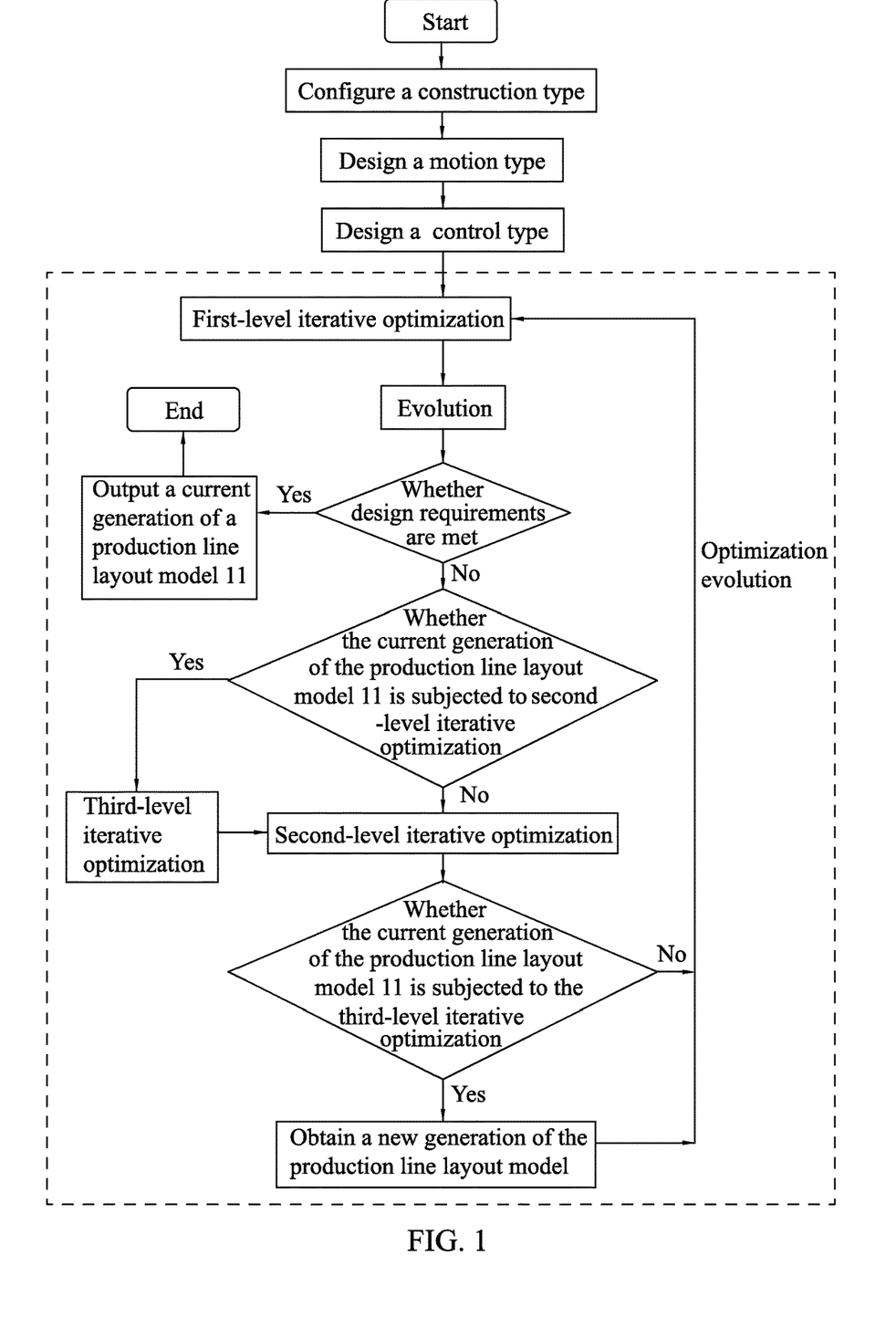
FIG. 1 is a flow chart of an embodiment of the disclosure.

In step A of construction type configuration, a three-dimensional model of each real-object device 2 is built in a simulation system 1 to form a plurality of real-object device digital models, and the plurality of real-object device digital models are assembled in the simulation system according to design requirements of a production line to form a production line layout model 11. Specifically, the design requirements comprise product machining technological characteristics, a technological process, technological requirements, a workshop logistics form and a site scale. Demo3D simulation software is used in the simulation system 1, which is provided with an open platform capable of performing three-dimensional digitalization design, may materialize a digital model of the device to perform virtual assembly, may compile a control script to control a motion of the device or a movement of work-in-process, and is provided with a soft PLC module.

In step B of motion type design, motion control scripts of all the real-object device digital models are compiled in the production line layout model 11 in the simulation system 1 according to the design requirements of the production line, and machining motions of the real-object device digital models and logistics transportation of the work-in-process are controlled through a script language.

In step C of control type design, the simulation system 1 is provided with a control center 12 for controlling the production line layout model 11 and the real-object device 2 to operate.

Real-time communication and motion synchronization are established between each real-object device 2 and the corresponding real-object device digital model in the production line layout model 11 by using a digital twin technology, so that information exchange and motion synchronization between each real-object device 2 and the corresponding real-object device digital model in the production line layout model 11 are realized.

An upper computer 3 is set, and a binary channel of instruction downlink and information uplink is established for the upper computer 3 and the control center 12, so that the upper computer 3 issues a production instruction to the control center 12 and the upper computer 3 collects real-time state data of the real-object device 2.

An industrial control network 4 for driving the real-object device 2 to operate is built, the production instruction is issued to the real-object device 2 through the industrial control network 4 by the control center 12, and the real-time state data of the real-object device 2 is acquired through the industrial control network 4.

In step D of optimization type evolution, the optimization type refers to iterative optimization performed on the production line layout model 11, and the iterative optimization comprises the followings.

In first-level iterative optimization, the upper computer 3 comprises a management and control center 31, the management and control center 31 comprises an execution engine 311 and a MES system 312, and the MES system 312 analyzes a machining technology and a logistics organization form of products in a workshop, and discriminates a coupling structure of the production line layout model 11 and a coupling optimization problem during production. The MES system (Manufacturing Execution System) refers to a production process execution system of a manufacturing enterprise, which is a production information management system oriented to a workshop execution layer of the manufacturing enterprise. The MES system may provide the enterprise with a manufacturing coordination management platform comprising management modules such as manufacturing data management, planning and scheduling management, production scheduling management, inventory management, quality management, work center/device management, production process control, bottom-layer data integration analysis, upper-layer data integration decomposition, and the like. Specifically, the coupling structure comprises coupling between batching and blanking or coupling between the batching and a production plan in the production line layout model during glass production and machining. The coupling optimization problem refers to selecting the coupling structure suitable for the production line layout model 11 from the coupling between the batching and the blanking or the coupling between the batching and the production plan.

The execution engine 311 is a decoupling algorithm with a decoupling mechanism, which solves the coupling optimization problem in the production line layout model 11, and generates a production scheme of the production line layout model 11. The coupling optimization problem is solved through the execution engine 311, so that a bottleneck technology is solved, and an overall operation efficiency and a production benefit of the production line are improved.

Figure 2:
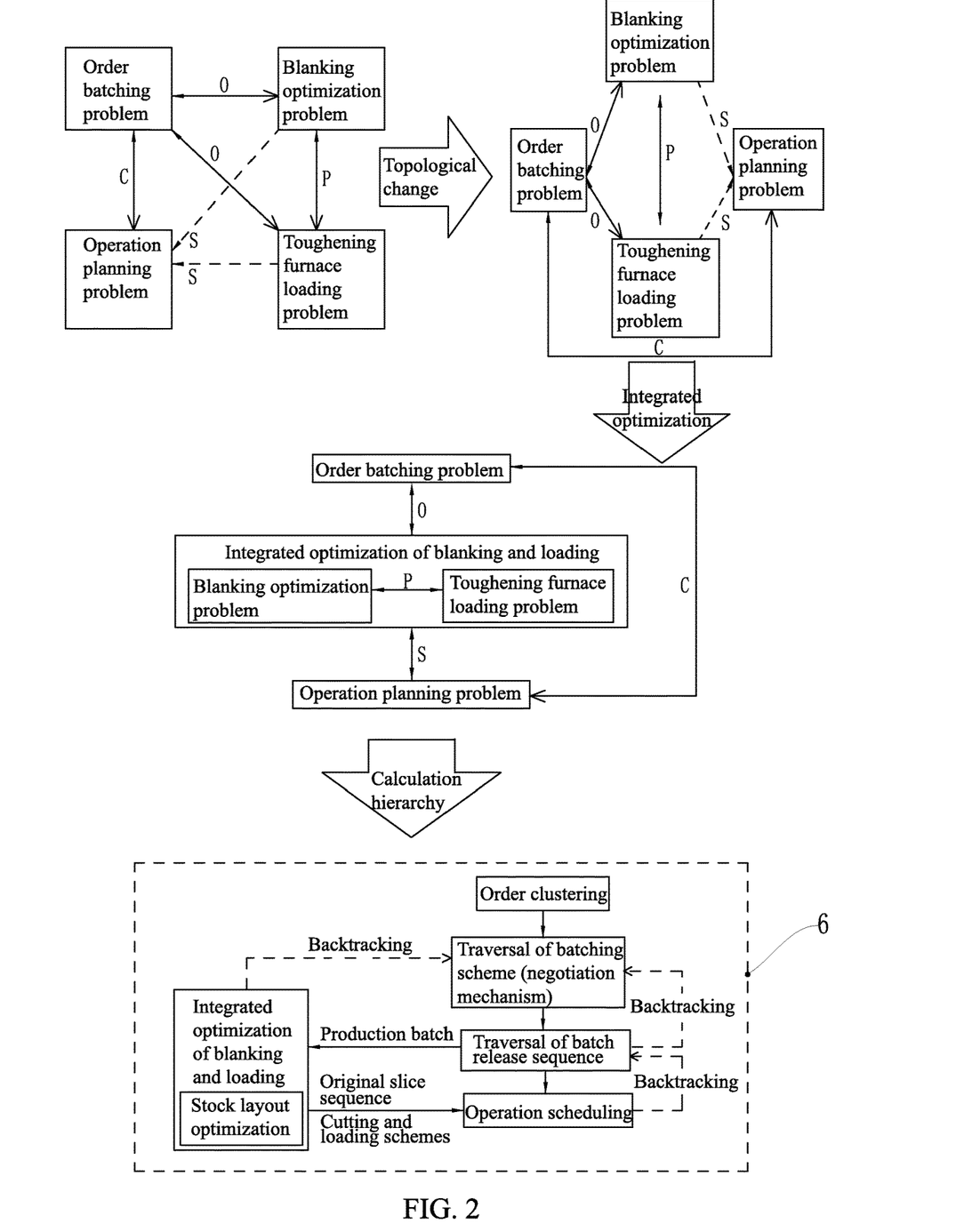
FIG. 2 is a schematic diagram of generating a hierarchical calculation relationship graph in an embodiment of the disclosure.
Figure 3:
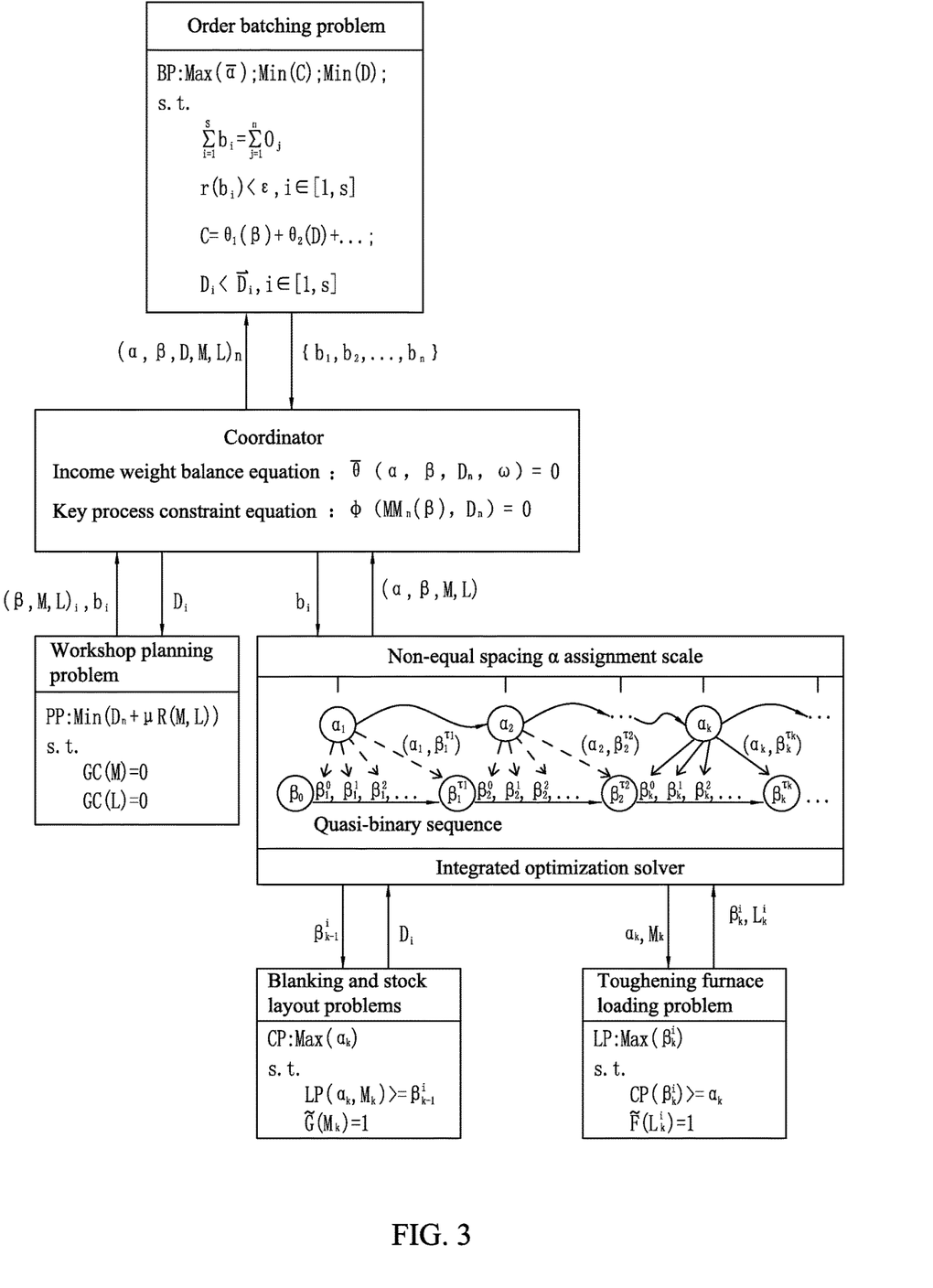
FIG. 3 is a schematic diagram of a decoupling algorithm framework in an embodiment of the disclosure.
Figure 4:
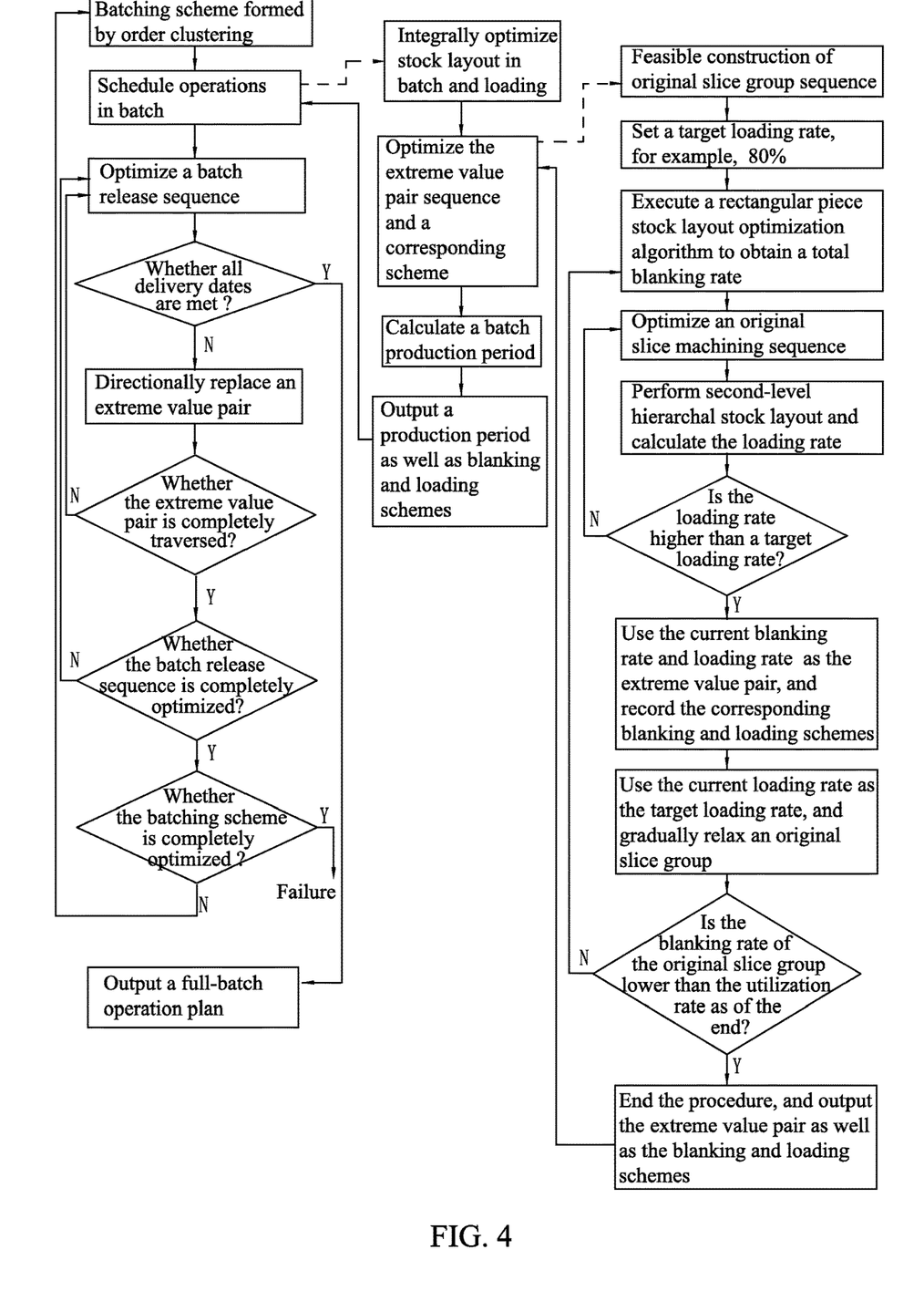
FIG. 4 is a decoupling flow chart in an embodiment of the disclosure.

Specifically, with reference to FIG. 2 to FIG. 4, the decoupling mechanism is exemplified by a coupling optimization problem model of "batching-blanking-loading-planning" in a glass production and machining line, the "batching" in the coupling optimization problem model refers to an order batching problem, the "blanking" refers to a blanking optimization problem, the "loading" refers to a toughening furnace loading problem, and the "planning" refers to an operation planning problem. All the above problems are independent units, and have algorithms to solve the problems, which are called unit algorithms hereinafter.

Firstly, a computational decoupling method is used, and basic calculation forms such as traversal, backtracking and recursion are integrated with each unit algorithm in the coupling optimization problem model to form a hierarchical calculation relationship graph with a clear hierarchy. In the coupling optimization problem model, target coupling and constraint coupling have a relatively clear partial order relation of calculation, and a project is combined with conventional calculation modes such as nesting, recursion and backtracking to decouple the target coupling and the constraint coupling. However, a process coupling relationship in the coupling optimization problem model belongs to a cross coupling relationship, and a calculation hierarchy between two unit problems has no clear boundary, so that a seesaw phenomenon inevitably exists in a solving process. In the project, two problems with process coupling are encapsulated into an integrated optimization problem, and a potential mutually exclusive relationship among a blanking rate, a loading rate and a delivery date is coordinated and calculated by negotiation. Therefore, as shown in FIG. 2, an integrated optimization mechanism and a basic calculation form are merged to form the hierarchical calculation relationship graph 6 with the clear hierarchy through topological deformation of a problem structure. Then, a Pareto-like extreme value pair sequence is generated by using a natural gap in a variable value domain, and traversal thereof is used as a coordinated calculation form to form a decoupling algorithm framework shown in FIG. 3. Finally, an execution process of a unit optimization algorithm is merged to form a decoupling flow chart shown in FIG. 4.

The hierarchical calculation relationship graph 6 will be used as a main basis for constructing the decoupling calculation framework. As shown in FIG. 2, a minimum deviation constraint of a batch delivery date is met by controlling a cluster radius formed by order clustering to form several feasible batching schemes, which are traversed and optimized. Multi-path backtracking exists in the optimization process, so that a negotiation mechanism needs to be set to avoid repeated searching. Traversal of a production batch release sequence belongs to a pre-processing procedure of operation scheduling, and will be used as a peripheral calculation hierarchy of an operation scheduling algorithm. The blanking problem and the loading problem are encapsulated into an integrated optimization problem of blanking and loading, which is solved in cooperation with a special coordination calculation mechanism on the basis of using stock layout optimization as an atomic solution engine.

In the hierarchical calculation relationship graph 6, a conflict between the blanking rate $\alpha$ and the loading rate $\beta$ needs to be solved first. According to an idea of combining the project with multi-objective optimization, a discrete non-dominated solution set in a Pareto-like form is generated, which is namely an extreme value pair sequence of $\alpha$ and $\beta$, and an integrated optimization solver is formed by using traversal calculation for the sequence in combination with two unit optimization algorithms of stock layout and scheduling, thus realizing coordinated calculation of stock layout and scheduling. Values of α and β are continuous, a Pareto-like discrete (α, β) extreme value pair is constructed, and discretization of variables needs to be solved first. Based on a naturally existing non-equal spacing jump characteristic of original slice group area assignment, the project generates an α monotone decreasing assignment sequence (α1, α2, . . . ), and determines a value of β by a quasi-binary traversal mode. A loading rate β0 under a minimum requirement is initialized first, and a corresponding optimal blanking rate α1 is acquired. Then, a quasi-binary sequence of β (β10, β11, . . . ) is constructed based on α1 and β0, and an optimal loading rate β1τ1 at an α1 level is searched, thus forming an extreme value pair (α1, β1τ1). The extreme value pair sequence is generated by recursion in this way.

In the hierarchical calculation relationship graph 6, traversal of a batching scheme needs to be negotiated. In the project, a coordinator is constructed through an income weight balance equation and a key process constraint equation, wherein Dn is a delivery date of a production batch n; ω is a weight vector of α, β and Dn, which is assigned according to needs of application scenarios and used for indicating importance of the blanking rate, the loading rate and the delivery date; and MMn(β) is a derivation function of a shortest completion date, and the shortest completion date is derived forward by taking a toughening process as a key process.

The optimization may be performed during evaluation of a blanking rate, a stock layout rate and an earliest delivery date through the income weight balance equation in combination with the extreme value pair sequence, and a potential logical relationship among blanking, stock layout and scheduling may be implicitly characterized through the key process constraint equation.

In the hierarchical calculation relationship graph 6, a cutting scheme M and a loading scheme L will be used as parameters of an operation planning problem (PP), and form group constraints GC(M) and GC(L). In fact, an implicit connection also exists between the cutting scheme M and the loading scheme L, and a corresponding relationship exists between a blanking sequence of raw materials and furnace loading sequence, which has a strong enlightening significance. When solving the scheduling problem, the enlightening information should be fully used, or more directly cooperated with a weight factor to be used as a component of an optimization objective.

In the hierarchical calculation relationship graph 6, the order batching problem (BP) is a top-level problem of the coupling optimization problem, with maximization of an average blanking rate, minimization of operational input (C) and maximum shortening of the delivery date (D) as the optimization objectives, wherein C is composed of the blanking rate, the delivery date and other deterministic factors. In addition to meeting most basic constraints such as a total number of batch slices being equal to a total number of order slices, and the like, a cluster radius r(b) should not be higher than a minimum delivery date deviation E, wherein b is a production batch. A delivery date of each production batch should be no later than a latest delivery date determined by the order delivery date, and the decoupling flow chart shown in FIG. 4 is obtained in combination with the above idea. As shown in FIG. 4, second-level recursive call exists in the decoupling flow chart: "batching scheme formed by order batching clustering" will calla lower-level clustering algorithm to perform the batching, "batch operation scheduling" will call a lower-level scheduling algorithm to form the operation planning, "total blanking rate obtained by executing rectangular piece stock layout optimization algorithm" and "loading rate calculated by performing second-level hierarchical stock layout" will closely rely on the rectangular piece stock layout optimization algorithm to generate the blanking scheme and the loading scheme.

In two-level iterative optimization, technological motions of the real-object device digital models and a transportation path of the work-in-process in the production line layout model 11 are optimized and adjusted according to the design requirements, the motion control script is optimized and adjusted in the simulation system 1 according to optimization of the technological motions and the transportation path, and the industrial control network 4 makes self-adaptive adjustment synchronously according to a change of the motion control script. If the production line layout model 11 fails to meet the design requirements after the first-level iterative optimization, the second-level iterative optimization is performed. Specifically, the technological motions of the real-object device digital models are optimized according to the design requirements, so that motions of the real-object device digital models are simplified, and the transportation path of the work-in-process in the production line layout model 11 is optimized, so that the transportation efficiency of the work-in-process is improved, thus improving the production efficiency of the production line layout model 11. The motion control script is optimized and adjusted in the simulation system 1 according to changes of the technological motions and the transportation path, so that the production line layout model 11 is optimized to meet the design requirements. The industrial control network 4 making self-adaptive adjustment synchronously according to the change of the motion control script refers to that: if the motions of the original real-object device digital models are split or combined to form a new motion mode, the industrial control network 4 may also be changed with the change of the motion mode, and if the motions of the real-object device digital models are increased, point information of the industrial control network 4 may also be increased. If the motions of the real-object device digital models are reduced, the point information of the industrial control network 4 may also be reduced, so that the control type design makes self-adaptive optimization and adjustment according to the change of the motion type design.

In three-level iterative optimization, the production line layout model 11 is rebuilt in the simulation system 1. If the production line layout model 11 fails to meet the design requirements after the first-level iterative optimization and the second-level iterative optimization, the third-level iterative optimization is performed. Specifically, a technological route, a priority relationship among processes, as well as a location, a type and a quantity of the real-object device in the production line layout model 11 are adjusted according to the design requirements. For example, the technological route of the original production line layout model 11 is changed from scribing-edging-cleaning-punching-cleaning to scribing-punching-edging-cleaning, and all the real-object device digital models in the production line layout model 11 are re-arranged according to the change of the technological route, thus realizing overall optimization.

The evolution refers to online simulation production performed on the production line layout model 11 subjected to the first-level iterative optimization, and detects whether each real-object device 2 meets preset production requirements.

If each real-object device meets the preset production requirements, the current generation of the production line layout model 11 is outputted.

If each real-object device does not meet the preset production requirements, whether the current generation of the production line layout model 11 is subjected to the second-level iterative optimization is determined.

If the current generation of the production line layout model 11 is not subjected to the second-level iterative optimization, the current generation of the production line layout model 11 enters the second-level iterative optimization.

If the current generation of the production line layout model 11 is already subjected to the second-level iterative optimization, the current generation of the production line layout model 11 enters the third-level iterative optimization first, and then enters the second-level iterative optimization.

After finishing the second-level iterative optimization, whether the current generation of the production line layout model 11 is subjected to the third-level iterative optimization is determined.

If the current generation of the production line layout model 11 is not subjected to the third-level iterative optimization, the current generation of the production line layout model 11 enters the first-level iterative optimization again.

If the current generation of the production line layout model 11 is already subjected to the third-level iterative optimization, the production line layout model 11 is defined as a new generation of the production line layout model 11, and then enters the first-level iterative optimization.

The production line linkage design framework is formed through the construction type configuration, the motion type design, the control type design and the optimization type evolution, and self-adaptive synchronous configurations of a model, a logic, an event and a movement are performed under the driving of a specific manufacturing product type, a manufacturing technological system and production device information to form a linkage response mechanism. A materialized structure of a whole line is realized based on the production line linkage design framework, and the online simulation operation is performed on the production line layout model 11 in a form of semi-physical simulation, so that whether each real-object device 2 meets the preset production requirements is analyzed and detected, and an uncertainty between design and manufacturing is reduced, thus improving a design efficiency.

In the optimization type evolution, the workshop design scheme is optimized level by level to meet a manufacturing flexibility necessary for high-frequency product changes and a technological flexibility of a stand-alone device, so that the production line is quickly customized and designed, and progressive lossless propagation of a design idea is ensured. Moreover, a closed optimization cycle is formed by the first-level iterative optimization, the second-level iterative optimization and the third-level iterative optimization jointly, and the multi-level iterative optimization is performed on the production line linkage design framework, so that the workshop production line can be self-adaptively and quickly adjusted and designed.

Further, the execution engine 311 is a hyper-heuristic decoupling algorithm, and the hyper-heuristic decoupling algorithm is one of decoupling algorithms with a decoupling mechanism. The execution engine 311 performs online self-adaptive adjustment according to a change of a coupling optimization problem in each generation of the production line layout model 11, and the online self-adaptive adjustment comprises decoupling algorithm parameter adjustment and decoupling algorithm framework adjustment. Specifically, taking a multi-branch tree search algorithm as an example, the multi-branch tree search algorithm is a sub-algorithm in the decoupling algorithm, and the multi-branch tree search algorithm has tree layer parameters and tree node parameters. The algorithm parameter adjustment refers to self-adaptively adjusting the tree layer parameters and the tree node parameters according to a change of the coupling optimization problem in each generation of the production line layout model 11. Taking the multi-branch tree search algorithm as an example, the algorithm framework adjustment refers to self-adaptively selecting and transforming the corresponding algorithm framework according to the change of the coupling optimization problem in each generation of the production line layout model 11, such as changing original depth search into breadth search. An optimal solution for solving the design problem is worked out through the online self-adaptive adjustment of the hyper-heuristic algorithm, so that the coupling optimization problem of the production line is solved, the design requirements of the production line are met, and a production line efficiency and a device utilization are optimized, thus improving an overall operation efficiency and a production benefit of the production line to realize the first-level iterative optimization.

Figure 6:
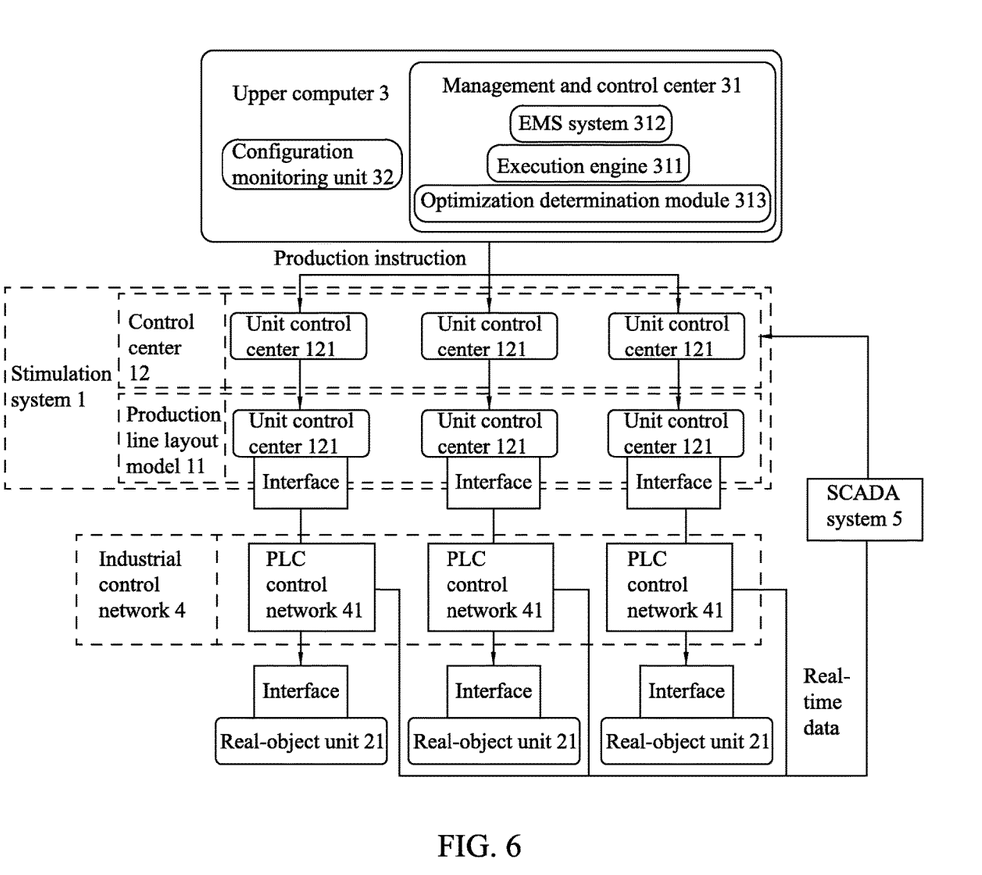
FIG. 6 is a principle diagram of an autonomous control system in an embodiment of the disclosure.

Further, the control type design in the step C further comprises: planning and designing an autonomous control system, and dividing the production line layout model 11 into a plurality of autonomous units 111 according to the design requirements of the production line, wherein the control center 12 is provided with unit control centers 121 with a same number as that of the autonomous units 111, one of the unit control centers 121 independently controls one of the autonomous units 111 to operate, and the real-object device 2 in the workshop constitutes a real-object unit 21 completely consistent with the autonomous unit 111. The production line layout model 11 is split into the plurality of autonomous units 111 to facilitate the control center 12 to reasonably control operation and maintenance of the production line layout model 11. The autonomous unit 111 may be a single real-object device digital model or a combination of the plurality of real-object device digital models. Specifically, for example, glass is picked up by a warehousing trolley and then transferred to a warehouse in a glass production and machining line, and a bottom trolley in the warehouse is scheduled to store the glass in a suitable location, and then the glass is taken out of the warehouse by a delivery trolley and transported to a next technological section for machining. The warehousing trolley, the warehouse and the delivery trolley may be classified into one autonomous unit 111, and the warehousing trolley, the warehouse and the delivery trolley are controlled through one unit control center 121. The autonomous unit being completely consistent with the real-object unit 21 refers to that all the real-object device digital models in the autonomous unit 111 are completely consistent with the corresponding real-object device 2 in the real-object unit 21, comprising an appearance and a shape of the device as well as arrangement of a sensor.

Further, the industrial control network 4 in the step C is a PLC control network 41. Specifically, the real-object unit 21 is bound with an I/O point of the soft PLC module of the autonomous unit 111 in a form of I/O point information through a switch interface by the PLC control network 41, thus realizing real-time communication between the corresponding real-object unit 21 and the autonomous unit 111, and the connected real-object unit 21 is operated under driving by the PLC control network 41. Each unit control center 121 converts the received production instruction into a machine instruction, and issues the machine instruction to the autonomous units 111 under management and control thereof, and the soft PLC module of each autonomous unit 111 synchronously sends the machine instruction to the PLC control network 41 of the corresponding real-object unit 21, thus realizing instruction synchronization. The simulation production is performed by each autonomous unit 111 in the production line layout model 11 according to the machine instruction, and the PLC control network 41 drives the connected real-object unit 21 to simulate production according to the machine instruction. Based on the digital twin technology, the corresponding autonomous unit 111 and the connected real-object unit 21 synchronously simulate production.

Figure 5:
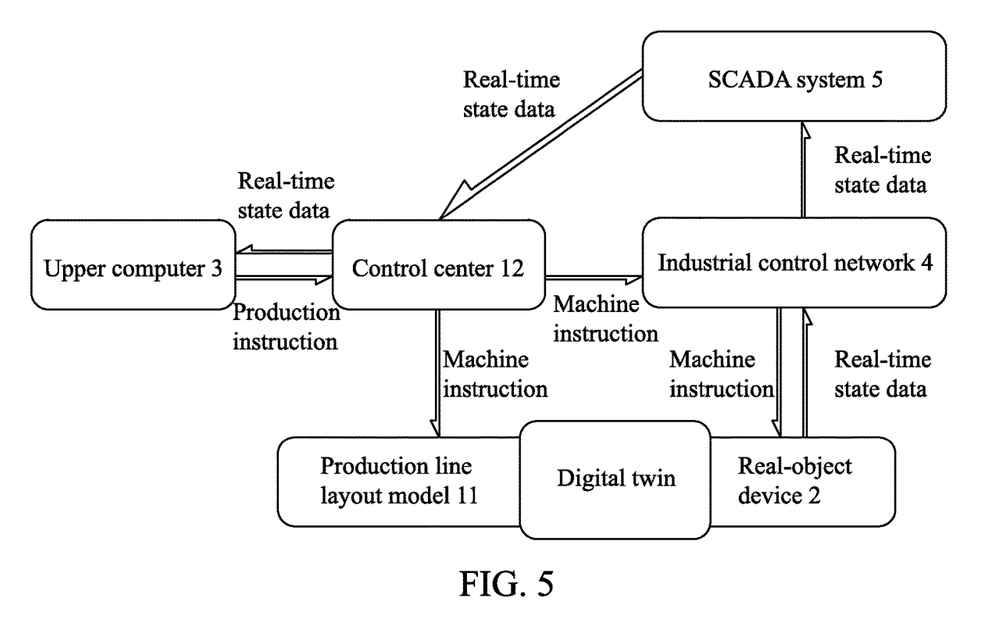
FIG. 5 is a working principle diagram of a system in an embodiment of the disclosure.

Further, the PLC control network 41 collects the real-time state data of the real-object device 2 through a SCADC system 5, and uploads the collected real-time state data to the upper computer 3. Specifically, the PLC control network 41 collects the real-time state data of the real-object device 2 through the SCADC system 5, which is namely a data collection and monitoring system, and uploads the collected real-time state data to the upper computer 3, so that the upper computer 3 may establish a simulation model view according to the real-time state data, and monitor the production line layout model 11 and each real-object device 2 in real time through the simulation model view. Moreover, the MES system 312 analyzes a machining technology and a logistics organization form of workshop products according to the real-time state data, and discriminates the coupling structure of the production line layout model 11 and the coupling optimization problem in a production process.

Further, the evolution in the step D comprises vertical integration evolution and horizontal integration evolution.

In the vertical integration evolution: each real-object unit 21 is respectively connected with the industrial control network 4 at different time periods, and the connected real-object unit 21 and the corresponding autonomous unit 111 perform synchronous simulation production according to the production instruction to detect whether each real-object device 2 in the connected real-object unit 21 is operated according to the production instruction.

In the horizontal integration evolution: two real-object units 21 associated up and down are connected with the industrial control network 4 at the same time period, the two connected real-object units 21 and the corresponding autonomous units 111 perform synchronous simulation production according to the production instruction respectively to detect whether the downstream real-object device 2 always undertakes a machining motion of the upstream real-object device 2 at a junction between the two connected real-object units 21.

Through the vertical integration evolution and the horizontal integration evolution, the connected real-object units 21 are evolved in a segmented manner and detected to quickly determine a fault location of the production line, thus being convenient to find and eliminate a design error and improving a design efficiency. Further, the evolution further comprises whole line integration evolution, each real-object unit 21 is connected with the industrial control network 4 at the same time period, and the online simulation production is performed on all the real-object devices 2 to detect the production efficiency of the whole line.

Further, the motion type design in the step B comprises the following steps of:

step B1: making a motion plan of each real-object device digital model and a transportation path plan of the work-in-process according to the design requirements of the production line and the production line layout model 11;

step B2: compiling the control scripts of all the real-object device digital models in the production line layout model 11 in the simulation system 1, and completing the motion plan of each real-object device digital model and the transportation path plan of the work-in-process through the control scripts; and step B3: performing an off-line simulation operation on the production line layout model 11 until the off-line operation is normal.

Specifically, according to the design requirements of the production line, such as standard working hours of each process in a product machining technology, motion planning of each real-object device digital model and transportation path planning of the work-in-process are made to determine a motion mode of each real-object device digital model in each link, and then the control script is compiled to complete the motion planning of each device and the transportation path planning of the work-in-process through the script language. Then, the off-line simulation operation is performed on the production line layout model 11 to verify whether each real-object device digital model can be operated normally, and if the production line layout model 11 cannot be operated normally, the control script is adjusted until the off-line operation is normal. The motion planning is made first and then the control script is compiled, which is beneficial for an integrity and a continuity of motions between the devices, thus ensuring that production and machining of the work-in-process are finished according to a flow, reducing adjustment times of the control script and improving the design efficiency.

With reference to FIG. 5 and FIG. 6, a system using the above self-adaptive configuration method for the linkage response of the construction type, the motion type, the control type and the optimization type comprises a simulation system 1, an industrial control network 4 and an upper computer 3.

The simulation system 1 is configured to build the real-object device digital model of each real-object device 2 according to the design requirements of the production line, and assemble the plurality of the real-object device digital models to form the production line layout model 11.

The simulation system 1 is further configured to compile the control scripts of all the real-object device digital models in the production line layout model 11, and perform the off-line simulation operation on the production line layout model 11 until the off-line operation is normal.

The simulation system 1 is provided with the control center 12 for controlling the production line layout model 11 and the real-object device 2 to operate.

The real-time communication and the motion synchronization are established between each real-object device 2 and the corresponding real-object device digital model in the production line layout model 11 by using the digital twin technology.

The upper computer 3 is set, the binary channel of the instruction downlink and the information uplink is established for the upper computer 3 and the control center 12, so that the upper computer 3 issues the production instruction to the control center 12 and the upper computer 3 collects the real-time state data of the real-object device 2.

The industrial control network 4 is configured to drive the real-object device 21 to operate, the control center 12 issues the production instruction to the real-object device 2 through the industrial control network 4 and acquires the real-time state data of the real-object device 2 through the industrial control network 4.

The upper computer 3 comprises the management and control center 31 and the configuration monitoring unit 32.

The management and control center 31 comprises the execution engine 311, the MES system 312 and the optimization determination module 313.

The MES system 312 is configured to analyze the machining technology and the logistics organization form of the products in the workshop, and discriminate the coupling structure of the production line layout model 11 and the coupling optimization problem during production.

The execution engine 311 is a decoupling algorithm with a decoupling mechanism, which solves the coupling optimization problem in the production line layout model 11, and generates a production scheme of the production line layout model 11.

The optimization determination module 313 is configured to determine an optimization evolution flow of the production line layout model 11.

After finishing the evolution, the optimization determination module 313 determines whether each real-object device 2 meets preset production requirements.

If each real-object device meets the preset production requirements, the current generation of the production line layout model 11 is outputted.

If each real-object device does not meet the preset production requirements, the optimization determination module 313 determines whether the current generation of the production line layout model 11 is subjected to the second-level iterative optimization.

If the current generation of the production line layout model 11 is not subjected to the second-level iterative optimization, the current generation of the production line layout model 11 enters the second-level iterative optimization.

If the current generation of the production line layout model 11 is already subjected to the second-level iterative optimization, the current generation of the production line layout model 11 enters the third-level iterative optimization first, and then enters the second-level iterative optimization.

After finishing the second-level iterative optimization, the optimization determination module 313 determines whether the current generation of the production line layout model 11 is subjected to the third-level iterative optimization.

If the current generation of the production line layout model 11 is not subjected to the third-level iterative optimization, the current generation of the production line layout model 11 enters the first-level iterative optimization again.

If the current generation of the production line layout model 11 is already subjected to the third-level iterative optimization, the production line layout model 11 is defined as a new generation of the production line layout model 11, and then enters the first-level iterative optimization.

The configuration monitoring unit 32 is configured to establish a simulation model view according to the real-time state data, and monitor the production line layout model 11 and each real-object device 2 in real time through the simulation model view.

The construction type configuration, the motion type design and the control type design are finished through the stimulation system 1, and the optimization type evolution is finished through the upper computer 3, thus forming the production line linkage design framework. Self-adaptive synchronous configurations of a model, a logic, an event and a movement are performed under the driving of a specific manufacturing product type, a manufacturing technological system and production device information to form a linkage response mechanism. A materialized structure of a whole line is realized based on the production line linkage design framework. The online simulation operation is performed on the production line layout model 11 in a form of semi-physical simulation based on the industrial control network 4 and the digital twin technology. The operation of each real-object device 2 is monitored in real time through the configuration monitoring unit 32, and whether each real-object device 2 meets the preset production requirements is analyzed and detected through the management and control center 31, so that an uncertainty between design and manufacturing is reduced, thus improving a design efficiency.

In the optimization type evolution, the workshop design scheme is optimized level by level to meet a manufacturing flexibility necessary for high-frequency product changes and a technological flexibility of a stand-alone device, so that the production line is quickly customized and designed, and progressive lossless propagation of a design idea is ensured. Moreover, a closed optimization cycle is formed by the first-level iterative optimization, the second-level iterative optimization and the third-level iterative optimization jointly, and an iterative optimization flow is performed on the production line linkage design framework through the optimization determination module 313, so that the workshop production line can be self-adaptively and quickly adjusted and designed.

Further, the industrial control network 4 is a PLC control network 41.

Specifically, the real-object unit 21 is bound with an I/O point of the soft PLC module of the autonomous unit 111 in a form of I/O point information through a switch interface by the PLC control network 41, thus realizing real-time communication between the corresponding real-object unit 21 and the autonomous unit 111, and the connected real-object unit 21 is operated under driving by the PLC control network 41. Each unit control center 121 converts the received production instruction into a machine instruction, and issues the machine instruction to the autonomous units 111 under management and control thereof, and the soft PLC module of each autonomous unit 111 synchronously sends the machine instruction to the PLC control network 41 of the corresponding real-object unit 21, thus realizing instruction synchronization. The simulation production is performed by each autonomous unit 111 in the production line layout model 11 according to the machine instruction, and the PLC control network 41 drives the connected real-object unit 21 to simulate production according to the machine instruction. Based on the digital twin technology, the corresponding autonomous unit 111 and the connected real-object unit 21 synchronously simulate production.

Further, the PLC control network 41 collects the real-time state data of the production line layout model 1 and the real-object device 2 through a SCADC system 5, and uploads the collected real-time state data to the MES system 312 of the upper computer 3.

Specifically, the PLC control network 41 collects the real-time state data during the operation of the real-object device 2 through the SCADC system 5, which is namely a data collection and monitoring system, and uploads the collected real-time state data to the MES system 312 in the upper computer 3, and the real-time status data is collected and analyzed through the MES system 312, so that the configuration monitoring unit 32 in the upper computer 3 may establish a simulation model view according to the real-time state data, and monitor the production line layout model 11 and each real-object device 2 in real time through the simulation model view. Moreover, the MES system 312 analyzes a machining technology and a logistics organization form of workshop products according to the real-time state data, and discriminates the coupling structure of the production line layout model 11 and the coupling optimization problem during production.

The technical principles of the disclosure are described above with reference to the specific embodiments. These descriptions are only for the purpose of explaining the principles of the disclosure, and cannot be interpreted as limiting the scope of protection of the disclosure in any way. Based on the explanation herein, those skilled in the art may think of other specific embodiments of the disclosure without going through any creative work, which shall all fall within the scope of protection of the disclosure.

What is claimed is:

1. A self-adaptive configuration method for linkage response of a construction type, a motion type, a control type and an optimization type, comprising the following steps of:

step A: construction type configuration: building a three-dimensional model of each real-object device (2) in a simulation system (1) to form a plurality of real-object device digital models, and assembling the plurality of real-object device digital models in the simulation system according to design requirements of a production line to form a production line layout model (11);

step B: motion type design: compiling motion control scripts of all the real-object device digital models in the production line layout model (11) in the simulation system (1) according to the design requirements of the production line, and controlling machining motions of the real-object device digital models and logistics transportation of work-in-process through a script language;

step C: control type design: the simulation system (1) being provided with a control center (12) for controlling the production line layout model (11) and a real-object device (2) to operate;

establishing real-time communication and motion synchronization between each real-object device (2) and the corresponding real-object device digital model in the production line layout model (11) by using a digital twin technology;

setting an upper computer (3), establishing a binary channel of instruction downlink and information uplink for the upper computer (3) and the control center (12), so that the upper computer (3) issues a production instruction to the control center (12) and the upper computer (3) collects real-time state data of the real-object device (2);

building an industrial control network (4) for driving the real-object device (2) to operate, issuing, by the control center (12), production instruction to the real-object device (2) through an industrial control network (4) and acquiring the real-time state data of the real-object device (2) through the industrial control network; and step D: optimization type evolution: the optimization type referring to iterative optimization of the production line layout model (11), and the iterative optimization comprising:

first-level iterative optimization, the upper computer (3) comprising a management and control center (31), the management and control center (31) comprising an execution engine (311) and a MES system (312), and the MES system (312) analyzing a machining technology and a logistics organization form of products in a workshop, and discriminating a coupling structure of the production line layout model (11) and a coupling optimization problem during production; and the execution engine (311) being a decoupling algorithm with a decoupling mechanism, which solves the coupling optimization problem in the production line layout model (11), and generates a production scheme of the production line layout model (11);

two-level iterative optimization, optimizing and adjusting technological motions of the real-object device digital models and a transportation path of the work-in-process in the production line layout model (11) according to the design requirements, optimizing and adjusting the motion control script in the simulation system (1) according to the optimization of the technological motions and the transportation path, and making self-adaptive adjustment synchronously by the industrial control network (4) according to a change of the motion control script; and three-level iterative optimization, rebuilding the production line layout model (11) in the simulation system (1);

the evolution referring to online simulation production performed on the production line layout model (11) subjected to the first-level iterative optimization, and detecting whether each real-object device (2) meets preset production requirements;

if each real-object device meets the preset production requirements, outputting a current generation of the production line layout model (11);

if each real-object device does not meet the preset production requirements, determining whether the current generation of the production line layout model (11) is subjected to a second-level iterative optimization;

if the current generation of the production line layout model (11) is not subjected to the second-level iterative optimization, the current generation of the production line layout model (11) entering the second-level iterative optimization;

if the current generation of the production line layout model (11) is already subjected to the second-level iterative optimization, the current generation of the production line layout model (11) entering a third-level iterative optimization first, and then entering the second-level iterative optimization;

after finishing the second-level iterative optimization, determining whether the current generation of the production line layout model (11) is subjected to the third-level iterative optimization;

if the current generation of the production line layout model (11) is not subjected to the third-level iterative optimization, the current generation of the production line layout model (11) entering the first-level iterative optimization again;

if the current generation of the production line layout model (11) is already subjected to the third-level iterative optimization, the production line layout model (11) being defined as a new generation of the production line layout model (11), and then entering the first-level iterative optimization.

2. The self-adaptive configuration method for the linkage response of the construction type, the motion type, the control type and the optimization type according to claim 1, wherein the execution engine (311) is a hyper-heuristic decoupling algorithm, the execution engine (311) performs online self-adaptive adjustment according to a change of a coupling optimization problem in each generation of the production line layout model (11), and the online self-adaptive adjustment comprises decoupling algorithm parameter adjustment and decoupling algorithm framework adjustment.

3. The self-adaptive configuration method for the linkage response of the construction type, the motion type, the control type and the optimization type according to claim 1, wherein the control type design in the step C further comprises: planning and designing an autonomous control system, and dividing the production line layout model (11) into a plurality of autonomous units (111) according to the design requirements of the production line, wherein the control center (12) is provided with unit control centers (121) with a same number as that of the autonomous units (111), one of the unit control centers (121) independently controls one of the autonomous units (111) to operate, and the real-object device (2) in the workshop constitutes a real-object unit (21) completely consistent with the autonomous unit (111).

4. The self-adaptive configuration method for the linkage response of the construction type, the motion type, the control type and the optimization type according to claim 1, wherein the industrial control network (4) in the step C is a PLC control network (41).

5. The self-adaptive configuration method for the linkage response of the construction type, the motion type, the control type and the optimization type according to claim 4, wherein the PLC control network (41) collects the real-time state data of the real-object device (2) through a SCADC system (5), and uploads the collected real-time state data to the upper computer (3).

6. The self-adaptive configuration method for the linkage response of the construction type, the motion type, the control type and the optimization type according to claim 3, wherein the evolution in the step D comprises vertical integration evolution and horizontal integration evolution:

in the vertical integration evolution: each real-object unit (21) is respectively connected with the industrial control network (4) at different time periods, and the connected real-object unit (21) and the corresponding autonomous unit (111) perform synchronous simulation production according to the production instruction to detect whether each real-object device (2) in the connected real-object unit (21) is operated according to the production instruction; and in the horizontal integration evolution: two real-object units (21) associated up and down are connected with the industrial control network (4) at the same time period, the two connected real-object units (21) and the corresponding autonomous units (111) perform synchronous simulation production according to the production instruction respectively to detect whether the downstream real-object device (2) always undertakes a machining motion of the upstream real-object device (2) at a junction between the two connected real-object units (21).

7. The self-adaptive configuration method for the linkage response of the construction type, the motion type, the control type and the optimization type according to claim 1, wherein the motion type design in the step B comprises the following steps of:

step B1: making a motion plan of each real-object device digital model and a transportation path plan of the work-in-process according to the design requirements of the production line and the production line layout model (11);

step B2: compiling the control scripts of all the real-object device digital models in the production line layout model (11) in the simulation system (1), and completing the motion plan of each real-object device digital model and the transportation path plan of the work-in-process through the control scripts; and step B3: performing an off-line simulation operation on the production line layout model (11) until the off-line operation is normal.

8. A system using the self-adaptive configuration method for the linkage response of the construction type, the motion type, the control type and the optimization type according to claim 1, comprising a simulation system (1), an industrial control network (4) and an upper computer (3);

the simulation system (1) being configured to build the real-object device digital model of each real-object device (2) according to the design requirements of the production line, and assemble the plurality of the real-object device digital models to form the production line layout model (11);

the simulation system (1) being further configured to compile the control scripts of all the real-object device digital models in the production line layout model (11), and perform the off-line simulation operation on the production line layout model (11) until the off-line operation is normal;

the simulation system (1) being provided with the control center (12) for controlling the production line layout model (11) and the real-object device (2) to operate;

the industrial control network (4) being configured to drive the real-object device (21) to operate, the control center (12) issuing the production instruction to the real-object device (2) through the industrial control network (4) and acquiring the real-time state data of the real-object device (2) through the industrial control network (4);

the upper computer (3) comprising the management and control center (31) and the configuration monitoring unit (32);

the management and control center (31) comprising the execution engine (311), the MES system (312) and the optimization determination module (313);

the MES system (312) being configured to analyze the machining technology and the logistics organization form of the products in the workshop, and discriminate the coupling structure of the production line layout model (11) and the coupling optimization problem during production;

the optimization determination module (313) being configured to determine an optimization evolution flow of the production line layout model (11):

after finishing the evolution, the optimization determination module (313) determining whether each real-object device (2) meets preset production requirements:

if each real-object device does not meet the preset production requirements, the optimization determination module (313) determining whether the current generation of the production line layout model (11) is subjected to the second-level iterative optimization;

after finishing the second-level iterative optimization, the optimization determination module (313) determining whether the current generation of the production line layout model (11) is subjected to the third-level iterative optimization;

if the current generation of the production line layout model (11) is already subjected to the third-level iterative optimization, the production line layout model (11) being defined as a new generation of the production line layout model (11), and then entering the first-level iterative optimization; and the configuration monitoring unit (32) being configured to establish a simulation model view according to the real-time state data, and monitor the production line layout model (11) and each real-object device (2) in real time through the simulation model view.

9. The self-adaptive configuration system for the linkage response of the construction type, the motion type, the control type and the optimization type according to claim 8, wherein the industrial control network (4) is a PLC control network (41).

10. The self-adaptive configuration system for the linkage response of the construction type, the motion type, the control type and the optimization type according to claim 9, wherein the PLC control network (41) collects the real-time state data of the production line layout model (1) and the real-object device (2) through a SCADC system (5), and uploads the collected real-time state data to the MES system of the upper computer (3).

* * * * *